(12) United States Patent
Sakashita et al.

(10) Patent No.: US 11,993,848 B2
(45) Date of Patent: May 28, 2024

(54) GAS NOZZLE, SUBSTRATE PROCESSING APPARATUS, AND SUBSTRATE PROCESSING METHOD

(71) Applicant: Tokyo Electron Limited, Tokyo (JP)

(72) Inventors: Kuniyasu Sakashita, Oshu (JP); Satoru Ogawa, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 203 days.

(21) Appl. No.: 17/304,119

(22) Filed: Jun. 15, 2021

(65) Prior Publication Data

US 2021/0395893 A1  Dec. 23, 2021

(30) Foreign Application Priority Data

Jun. 19, 2020  (JP) .................... 2020-106472

(51) Int. Cl.
  C23C 16/455   (2006.01)
  C23C 16/34    (2006.01)
  C23C 16/40    (2006.01)
  H01L 21/02    (2006.01)

(52) U.S. Cl.
  CPC ...... *C23C 16/45578* (2013.01); *C23C 16/345* (2013.01); *C23C 16/401* (2013.01); *C23C 16/45544* (2013.01); *C23C 16/45574* (2013.01); *H01L 21/02164* (2013.01); *H01L 21/0217* (2013.01); *H01L 21/0228* (2013.01)

(58) Field of Classification Search
  CPC ................................ C23C 16/45578
  See application file for complete search history.

(56) References Cited

U.S. PATENT DOCUMENTS

| | | | | |
|---|---|---|---|---|
| 2004/0112290 | A1* | 6/2004 | Li | C23C 16/45563 118/715 |
| 2014/0357058 | A1* | 12/2014 | Takagi | C23C 16/45534 118/724 |
| 2018/0264516 | A1* | 9/2018 | Fujikawa | B05D 1/002 |
| 2018/0274098 | A1* | 9/2018 | Takagi | H01L 21/02271 |
| 2018/0277355 | A1* | 9/2018 | Takagi | C23C 16/45544 |
| 2019/0186014 | A1* | 6/2019 | Kikama | H01L 21/67109 |
| 2023/0055506 | A1* | 2/2023 | Kagaya | H01L 21/67017 |

FOREIGN PATENT DOCUMENTS

| | | |
|---|---|---|
| JP | 2013-157491 A | 8/2013 |
| JP | 2013-197329 A | 9/2013 |

* cited by examiner

*Primary Examiner* — Aiden Lee
(74) *Attorney, Agent, or Firm* — Armstrong Teasdale LLP

(57) ABSTRACT

A gas nozzle extending vertically inward of an inner wall of a processing container having a substantially cylindrical shape, includes a plurality of first gas holes provided at intervals in a longitudinal direction; and a second gas hole provided at a tip of the gas nozzle and oriented toward a side opposite to a side in which the plurality of first gas holes are provided in a plan view from the longitudinal direction, wherein the second gas hole has an opening area larger than an opening area of each of the first gas holes.

9 Claims, 14 Drawing Sheets

GAS NOZZLE, SUBSTRATE PROCESSING APPARATUS, AND SUBSTRATE PROCESSING METHOD

CROSS-REFERENCE TO RELATED APPLICATION

This application is based upon and claims the benefit of priority from Japanese Patent Application No. 2020-106472, filed on Jun. 19, 2020, the entire contents of which are incorporated herein by reference.

TECHNICAL FIELD

The present disclosure relates to a gas nozzle, a substrate processing apparatus, and a substrate processing method.

BACKGROUND

There is known a film forming apparatus which includes gas supply means equipped with a diffusion nozzle extending in the longitudinal direction of a processing container and having a plurality of gas injection holes formed therein, wherein a particle emission hole is provided in the upper end of the dispersion nozzle (see, for example, Patent Document 1).

Prior Art Document

Patent Document

Patent Document 1: Japanese Laid-Open Patent Publication No. 2013-157491

SUMMARY

According to an embodiment of the present disclosure, there is provided a gas nozzle extending vertically inward of an inner wall of a processing container having a substantially cylindrical shape, includes a plurality of first gas holes provided at intervals in a longitudinal direction; and a second gas hole provided at a tip of the gas nozzle and oriented toward a side opposite to a side in which the plurality of first gas holes are provided in a plan view from the longitudinal direction, wherein the second gas hole has an opening area larger than an opening area of each of the first gas holes.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
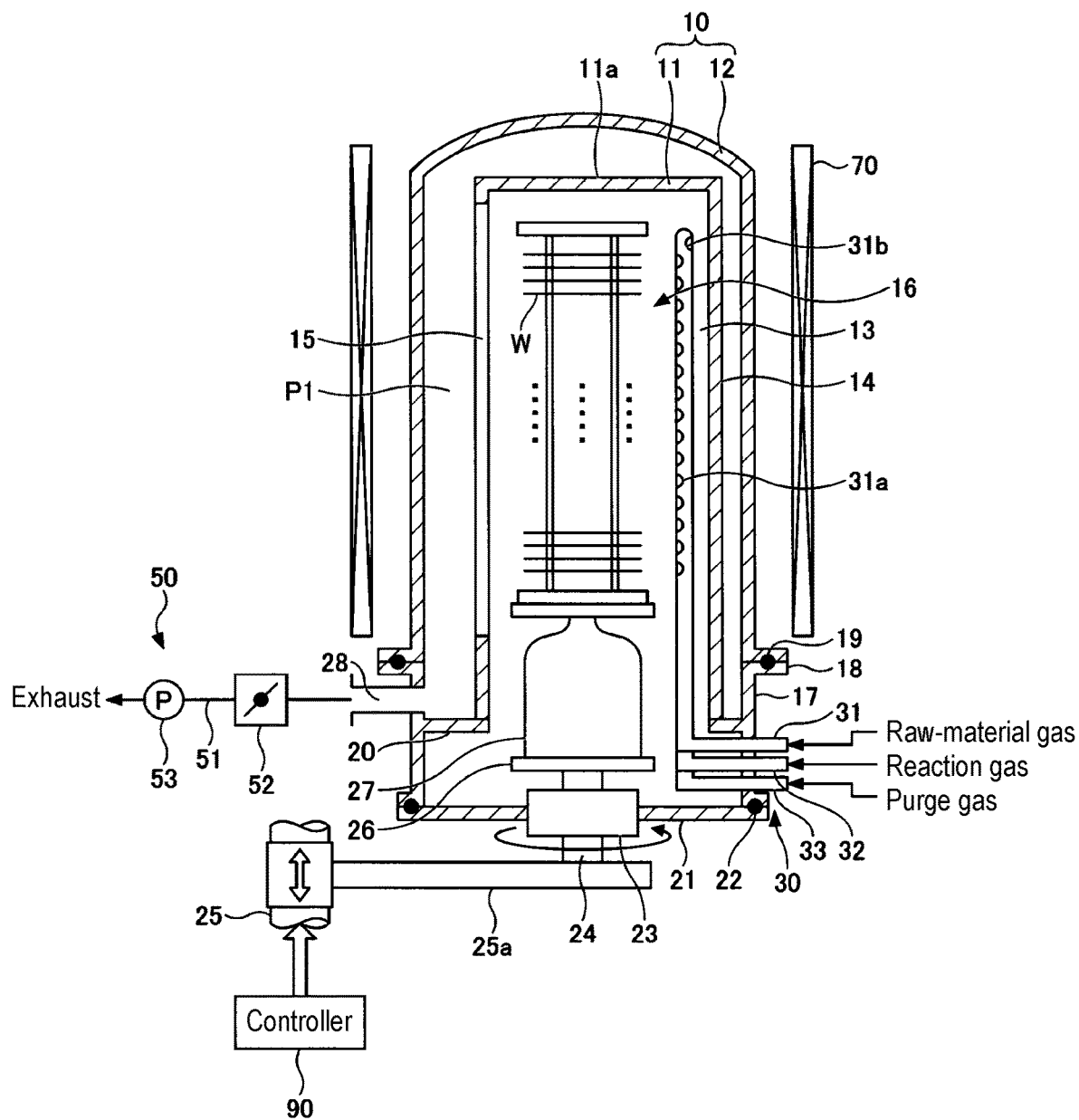
FIG. 1 is a schematic view illustrating an example of a substrate processing apparatus according to an embodiment.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus]

Figure 2:
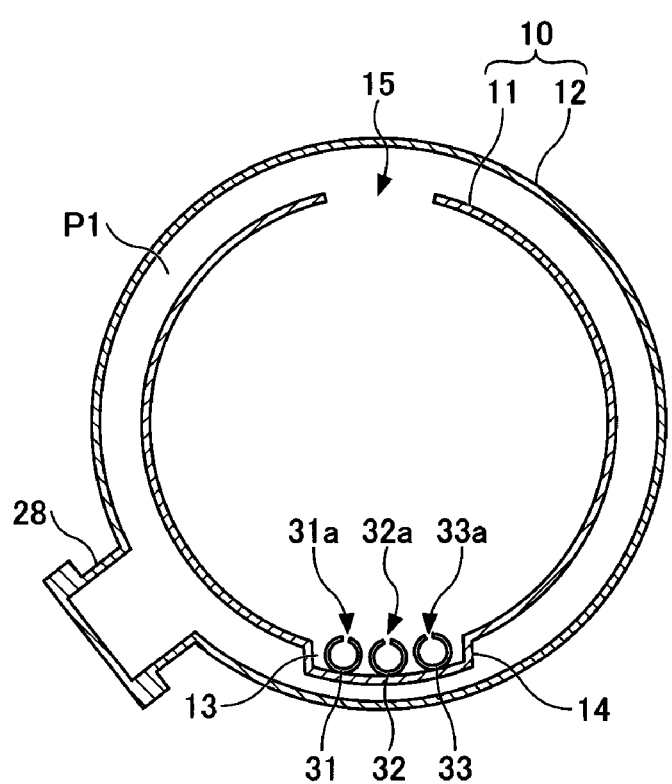
FIG. 2 is a view illustrating an arrangement of gas nozzles.

An example of a substrate processing apparatus of an embodiment will be described with reference to FIGS. 1 to 2. FIG. 1 is a schematic view illustrating an example of the substrate processing apparatus according to an embodiment. FIG. 2 is a view illustrating an arrangement of gas nozzles.

The substrate processing apparatus 1 includes a processing container 10, a gas supplier 30, an exhauster 50, a heater 70, and a controller 90.

The processing container 10 accommodates a boat 16. The boat 16 holds a plurality of substrates substantially horizontally at intervals in the vertical direction. The substrate may be, for example, a semiconductor wafer (hereinafter, referred to as a "wafer W"). The processing container 10 includes an internal tube 11 and an external tube 12. The internal tube 11 is also referred to as an "inner tube", and is formed in a substantially cylindrical shape having a ceiling and an open lower end. In the internal tube 11, a ceiling portion 11a is formed so as to be, for example, flat. The external tube 12 is also referred to as an "outer tube", and is formed in a substantially cylindrical shape having a ceiling and an open lower end. The external tube 12 covers the outside of the internal tube 11. The internal tube 11 and the external tube 12 are arranged in a coaxial relationship with each other so as to have a double-tube structure. The internal tube 11 and the external tube 12 are formed of a heat-resistant material such as quartz.

On one side of the internal tube 11, an accommodation portion 13 configured to accommodate a gas nozzle is provided along the longitudinal direction (the vertical direction) of the internal tube 11. In the accommodation portion 13, a portion of the side wall of the internal tube 11 protrudes outward so as to form a convex portion 14, and the interior of the convex portion 14 is formed as the accommodation portion 13. In the side wall of the internal tube 11 opposite to the accommodation portion 13, a rectangular opening 15 is formed in the longitudinal direction (the vertical direction) of the internal tube 11. The opening 15 is a gas exhaust port formed so as to be capable of exhausting the gas in the internal tube 11. A length of the opening 15 is equal to that of the boat 16, or extends in the vertical direction to be longer than the length of the boat 16.

A lower end of the processing container 10 is supported by a substantially cylindrical manifold 17 formed of, for example, stainless steel. A flange 18 is formed at an upper end of the manifold 17, and a lower end of the external tube 12 is installed and supported on the flange 18. A sealing member 19, such as an O-ring, is interposed between the flange 18 and the lower end of the external tube 12 so as to hermetically seal the interior of the external tube 12.

An annular support 20 is provided on an inner wall of an upper portion of the manifold 17, and the lower end of the internal tube 11 is installed and supported on the support 20. A lid 21 is hermetically installed on the opening in the lower end of the manifold 17 via a sealing member 22 such as an O-ring so as to hermetically close the opening in the lower end of the processing container 10, that is, the opening of the manifold 17. The lid 21 is formed of, for example, stainless steel.

A rotary shaft 24 configured to rotatably support the boat 16 is provided via a magnetic fluid seal 23 through the central portion of the lid 21. A lower portion of the rotary shaft 24 is rotatably supported by an arm 25a of a lift mechanism 25 configured as a boat elevator.

A rotary plate 26 is provided at an upper end of the rotary shaft 24. The boat 16, which holds the wafers W, is placed on the rotary plate 26 via a quartz heat-insulating base 27. Therefore, by moving the lift mechanism 25 up and down, the lid 21 and the boat 16 are movable up and down as a unit so as to insert the boat 16 into the processing container 10 or remove the same therefrom.

The gas supplier 30 is provided in the manifold 17. The gas supplier 30 includes a plurality of (e.g., three) gas nozzles 31 to 33.

As illustrated in FIG. 2, the plurality of gas nozzles 31 to 33 are arranged in a row inside the accommodation portion 13 of the internal tube 11 in the circumferential direction. Each of the plurality of gas nozzles 31 to 33 is provided within the internal tube 11 in the longitudinal direction of the internal tube 11. A base end of each nozzle is bent in an L shape and is supported by the manifold 17 while penetrating the manifold 17.

The gas nozzle 31 is provided with a plurality of gas holes 31a at a predetermined interval in the longitudinal direction thereof. The plurality of gas holes 31a are oriented toward, for example, the center side of the internal tube 11 (the wafers W). In addition, the tip of the gas nozzle 31 is provided with a tip hole 31b oriented toward the side opposite to the side at which the plurality of gas holes 31a are provided (toward the inner wall side near the internal tube 11) in a plan view. The gas nozzle 31 ejects a raw material gas, which is introduced from a raw material gas source (not illustrated), from the plurality of gas holes 31a toward the wafers W in a substantially horizontal direction. The raw material gas may be, for example, a gas containing silicon or a metal.

The gas nozzle 32 is provided with a plurality of gas holes 32a at a predetermined interval in the longitudinal direction thereof. The plurality of gas holes 32a are oriented toward, for example, the center side (the wafer W side) of the internal tube 11. In addition, the tip of the gas nozzle 32 is provided with a tip hole 32b oriented toward the side opposite to the side at which the plurality of gas holes 32a are provided (toward the inner wall side near the internal tube 11) in a plan view. The gas nozzle 32 ejects a reaction gas, which is introduced from a reaction gas source (not illustrated), from the plurality of gas holes 32a toward the wafers W in a substantially horizontal direction. The reaction gas is a gas for reacting with the raw material gas to produce a reaction product, and may be, for example, a gas containing oxygen or nitrogen.

The gas nozzle 33 is provided with a plurality of gas holes 33a at a predetermined interval in the longitudinal direction thereof. The plurality of gas holes 33a are oriented toward, for example, the center side (the wafer W side) of the internal tube 11. The gas nozzle 33 ejects a purge gas, which is introduced from a purge gas source (not illustrated), from the plurality of gas holes 33a toward the wafers W in a substantially horizontal direction. The purge gas is a gas used for purging the raw material gas or the reaction gas remaining in the processing container 10, and may be an inert gas such as a nitrogen gas or an argon gas.

The exhauster 50 exhausts the gas that is discharged from the interior of the internal tube 11 through the opening 15 and is discharged from a gas outlet 28 through a space P1 between the internal tube 11 and the external tube 12. The gas outlet 28 is formed in an upper sidewall of the manifold 17 and above the support 20. An exhaust passage 51 is connected to the gas outlet 28. A pressure adjustment valve 52 and a vacuum pump 53 are sequentially provided in the exhaust passage 51 so as to evacuate the interior of the processing container 10.

The heater 70 is provided around the external tube 12. The heater 70 is provided, for example, on a base plate (not illustrated). The heater 70 has a substantially cylindrical shape so as to cover the external tube 12. The heater 70 includes, for example, a heating element, and heats the wafers W within the processing container 10.

The controller 90 controls the operation of each component of the substrate processing apparatus 1. The controller 90 may be, for example, a computer. A computer program that executes the operation of each component of the substrate processing apparatus 1 is stored in a non-transitory computer-readable storage medium. The storage medium may be, for example, a flexible disk, a compact disk, a hard disk, a flash memory, or a DVD.

[Gas Nozzle]

A configuration example of the gas nozzle 32 included in the substrate processing apparatus 1 of the embodiment will be described with reference to FIGS. 3 to 5.

Figure 3:
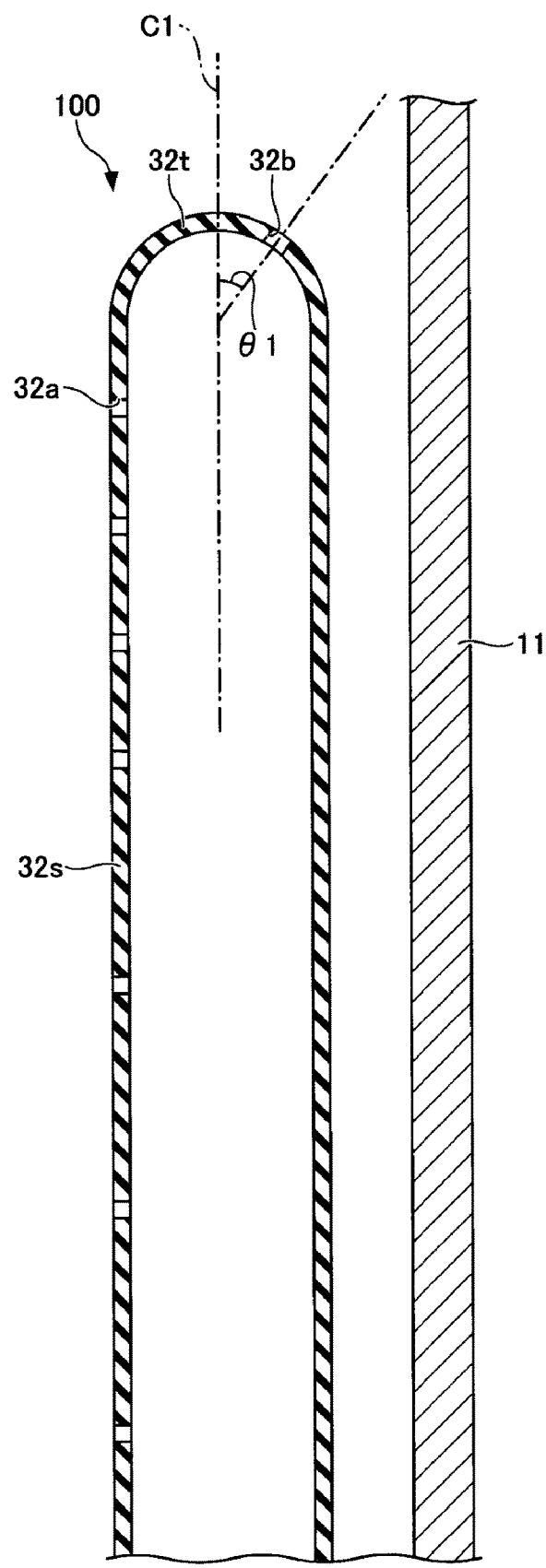
FIG. 3 is a view illustrating an example of a gas nozzle in a first configuration example.

FIG. 3 is a view illustrating an example of a gas nozzle 100 in a first configuration example, and is an enlarged cross-sectional view illustrating a portion including a tip of the gas nozzle 100.

The gas nozzle 100 includes a cylindrical portion 32s, a closing portion 32t, the plurality of gas holes 32a, and the tip hole 32b.

The cylindrical portion 32s has a substantially cylindrical shape, and is provided inside the internal tube 11 along the longitudinal direction thereof.

The closing portion 32t is located at a tip of the cylindrical portion 32s to close the tip. The closing portion 32t is formed in a rounded curved surface shape.

The plurality of gas holes 32a are provided in the cylindrical portion 32s at intervals along the longitudinal direction of the gas nozzle 100. The plurality of gas holes 32a are oriented toward the center side (the side of the wafer W) of the internal tube 11 and eject the reaction gas toward the wafers W in a substantially horizontal direction. Each gas hole 32a is a circular opening.

The tip hole 32b is provided at the tip of the gas nozzle 100, for example, the closing portion 32t. The tip hole 32b is oriented toward the side opposite to the side at which the plurality of gas holes 32a are provided (toward the inner wall side near the internal tube 11) in a plan view from the longitudinal direction of the gas nozzle 100. An orientation angle θ1 of the tip hole 32b with respect to a pipe axis C1 of the gas nozzle 100 ranges, for example, from 30 degrees to 90 degrees. As a result, the tip hole 32b ejects the reaction gas diagonally upward with respect to the inner wall side near the internal tube 11. The tip hole 32b is a circular opening. An opening area of the tip hole 32b is larger than that of each gas hole 32a. As a result, since the reaction gas is easily emitted from the tip of the gas nozzle 100, retention of the reaction gas at the tip of the gas nozzle 32 is suppressed. In addition, the opening area of the tip hole 32b is preferably twice the opening area of each gas hole 32a or less. This makes it possible to suppress a variation in flow velocity of the reaction gas inside the gas nozzle 100.

When the plurality of gas holes 32a are provided at intervals along the longitudinal direction of the gas nozzle 100, the reaction gas introduced into the gas nozzle 100 is gradually ejected from the side of the base end (lower end). Therefore, at the tip of the gas nozzle 100, the amount of the reaction gas is reduced and the flow velocity is slowed down, which may lead to the retention of the reaction gas.

According to the gas nozzle 100 of the first configuration example, the tip hole 32b having a larger opening area than each gas hole 32a is provided in the closing portion 32t. As a result, the reaction gas introduced into the gas nozzle 100 is efficiently emitted from the tip of the gas nozzle 100 so that the retention of the reaction gas at the tip of the gas nozzle 32 is suppressed.

In addition, the tip hole 32b is oriented toward the side opposite to the side at which the plurality of gas holes 32a are provided in a plan view from the longitudinal direction of the gas nozzle 100. As a result, it is possible to reduce the size of the gas retention region at the tip of the gas nozzle 100. As a result, it is possible to suppress deactivation of the reaction gas.

Figure 4:
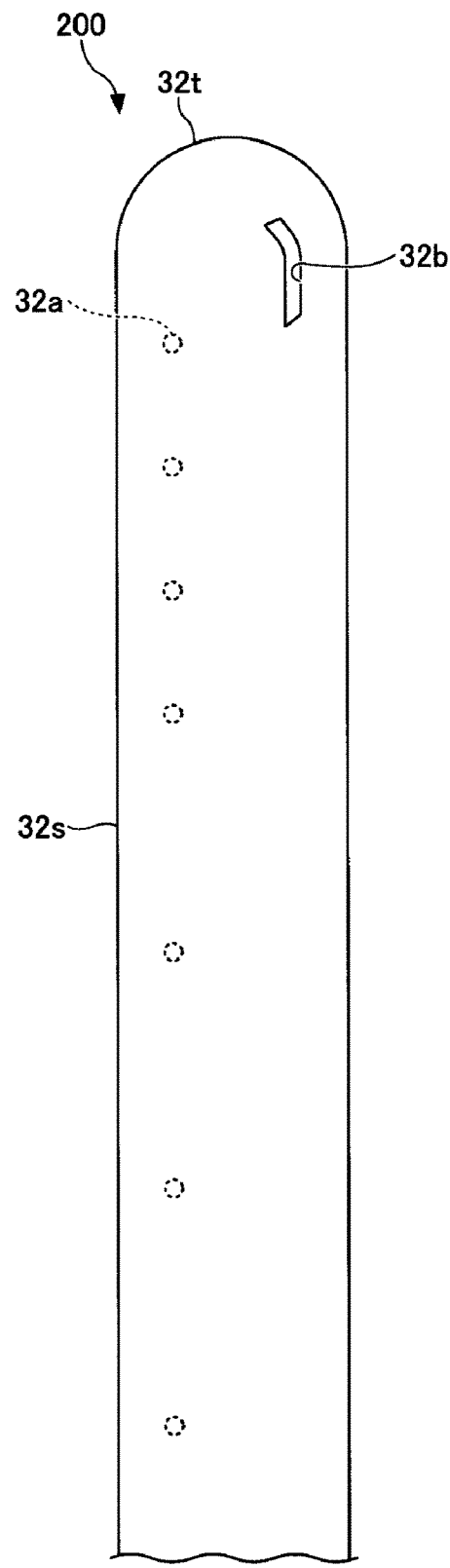
FIG. 4 is a view illustrating an example of a gas nozzle in a second configuration example.

FIG. 4 is a view illustrating an example of a gas nozzle 200 in a second configuration example, and is an enlarged perspective view illustrating an external appearance of a portion including a tip of the gas nozzle 200. The gas nozzle 200 differs from the gas nozzle 100 in that the tip hole 32b is a rectangular opening (slit). Since other features thereof are the same as those of the gas nozzle 100, features different from those of the gas nozzle 100 will be mainly described.

The tip hole 32b is a rectangular opening (slit) extending from the tip of the gas nozzle 200 (e.g., the upper portion of the cylindrical portion 32s) to the closing portion 32t and having long sides in the longitudinal direction of the gas nozzle 200 and short sides in the lateral direction of the gas nozzle 200. The tip hole 32b is oriented toward the side opposite to the side at which the plurality of gas holes 32a are provided in a plan view from the longitudinal direction of the gas nozzle 200. As a result, the tip hole 32b ejects the reaction gas diagonally upward as well as substantially horizontally toward the inner wall side near the internal tube 11. An opening area of the tip hole 32b is larger than that of each gas hole 32a. As a result, since the reaction gas is easily emitted from the tip of the gas nozzle 200, the retention of the reaction gas at the tip of the gas nozzle 200 is suppressed.

According to the gas nozzle 200 of the second configuration example, the tip hole 32b having a larger opening area than each gas hole 32a is provided from the upper portion of the cylindrical portion 32s to the closing portion 32t. As a result, the reaction gas introduced into the gas nozzle 200 is efficiently emitted from the tip of the gas nozzle 200 so that the retention of the reaction gas at the tip of the gas nozzle 200 is suppressed.

In addition, the tip hole 32b is oriented toward the side opposite to the side at which the plurality of gas holes 32a are provided in a plan view from the longitudinal direction of the gas nozzle 200. As a result, it is possible to reduce the gas retention region at the tip of the gas nozzle 200. As a result, it is possible to suppress deactivation of the reaction gas.

In the second configuration example, the case in which the tip hole 32b is a rectangular opening having the long sides in the longitudinal direction of the gas nozzle 200 and the short sides in the lateral direction of the gas nozzle 200 has been described, but the present disclosure is not limited thereto. For example, the tip hole 32b may be a rectangular opening having short sides in the longitudinal direction of the gas nozzle 200 and long sides in the lateral direction of the gas nozzle 200.

In addition, in the second configuration example, the case in which the tip hole 32b is a rectangular opening has been described, but the present disclosure is not limited thereto. For example, the tip hole 32b may be an elliptical or rounded rectangular opening. When the tip hole 32b is an elliptical opening, the tip hole 32b may have the major axis in the longitudinal direction of the gas nozzle 200 and the minor axis in the lateral direction of the gas nozzle 200, or the minor axis in the longitudinal direction of the gas nozzle 200 and the major axis in the lateral direction of the gas nozzle 200. When the tip hole is a rounded rectangular opening, the tip hole 32b may have long sides in the longitudinal direction of the gas nozzle 200 and short side in the lateral direction of the gas nozzle 200, or short sides in the longitudinal direction of the gas nozzle 200 and long sides in the lateral direction of the gas nozzle 200.

Figure 5:
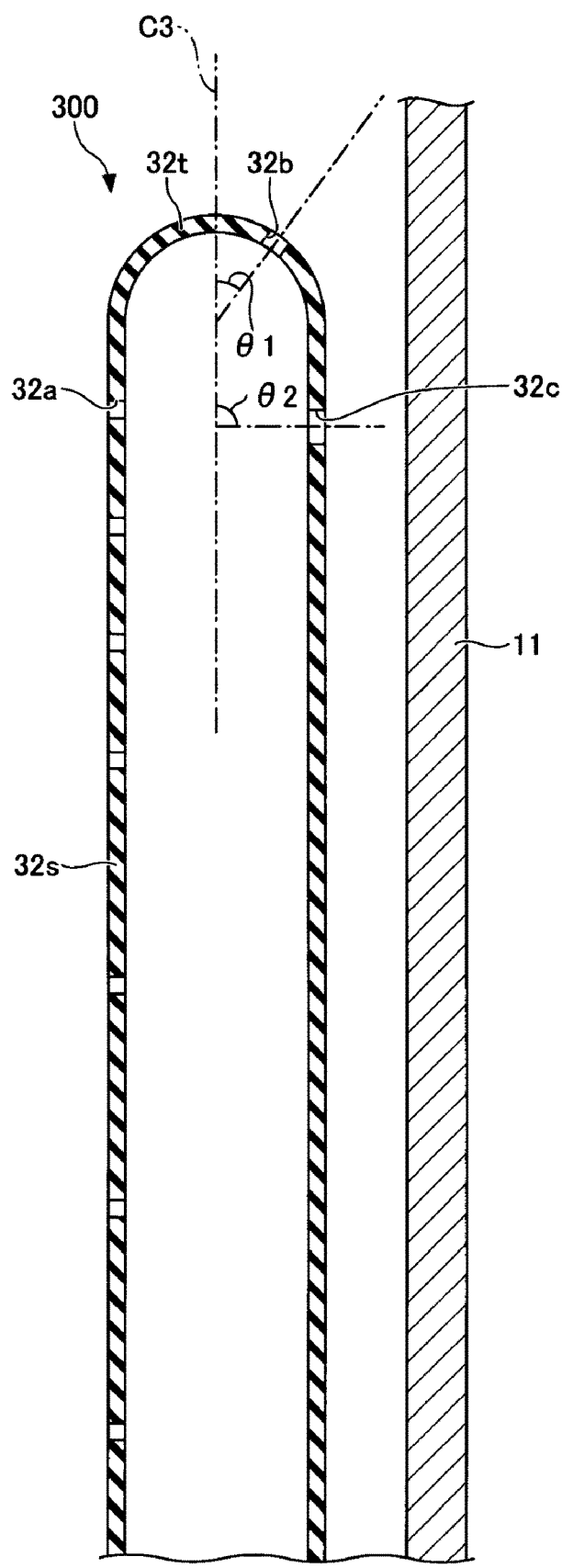
FIG. 5 is a view illustrating an example of a gas nozzle in a third configuration example.

FIG. 5 is a view illustrating an example of a gas nozzle 300 of a third configuration example, and is an enlarged cross-sectional view illustrating a portion including a tip of the gas nozzle 300. The gas nozzle 300 differs from the gas nozzle 100 in that it has a second tip hole 32c in addition to the plurality of gas holes 32a and the tip hole 32b. Since other features thereof are the same as those of the gas nozzle 100, features different from those of the gas nozzle 100 will be mainly described.

The second tip hole 32c is provided at the tip of the gas nozzle 300, for example, the upper portion of the cylindrical portion 32s. The second tip hole 32c is oriented toward the side opposite to the side at which the plurality of gas holes 32a are provided (toward the inner wall side near the internal tube 11) in a plan view from the longitudinal direction of the gas nozzle 300. An orientation angle θ2 of the second tip hole 32c with respect to a pipe axis C3 of the gas nozzle 300 differs from the orientation angle θ1 of the tip hole 32b, and is, for example, 90 degrees. As a result, the second tip hole 32c ejects the reaction gas substantially horizontally toward the inner wall side near the internal tube 11. The second tip hole 32c is a circular opening. An opening area of the second tip hole 32c is larger than that of each gas hole 32a. As a result, since the reaction gas is easily emitted from the tip of the gas nozzle 300, retention of the reaction gas at the tip of the gas nozzle 300 is suppressed.

According to the gas nozzle 300 of the third configuration example, the tip hole 32b having a larger opening area than each gas hole 32a is provided in the closing portion 32t, and the second tip hole 32c, which has a larger opening area than each gas hole 32a, is provided in the upper portion of the cylindrical portion 32s. As a result, the reaction gas introduced into the gas nozzle 300 is efficiently emitted from the tip of the gas nozzle 300 so that the retention of the reaction gas at the tip of the gas nozzle 300 is suppressed.

In addition, the tip hole 32b and the second tip hole 32c are oriented toward the side opposite to the side at which the plurality of gas holes 32a are provided in a plan view from the longitudinal direction of the gas nozzle 300. As a result, it is possible to reduce the size of the gas retention region at the tip of the gas nozzle 300. As a result, it is possible to suppress deactivation of the reaction gas.

In addition, in the third configuration example, the case in which the tip hole 32b and the second tip hole 32c are circular openings has been described, but the present disclosure is not limited thereto. For example, the tip hole 32b and the second tip hole 32c may be rectangular, elliptical, or rounded rectangular openings.

[Particle Generation Mechanism]

A particle generation mechanism will be described with reference to FIGS. 6A to 6D. FIGS. 6A to 6D are views illustrating the particle generation mechanism. FIGS. 6A to 6D illustrate operations of an atomic layer deposition (ALD) method in which a gas A and a gas B that react with each other are alternately supplied with purging therebetween so as to deposit a reaction product of the gas A and the gas B.

Figure 6:
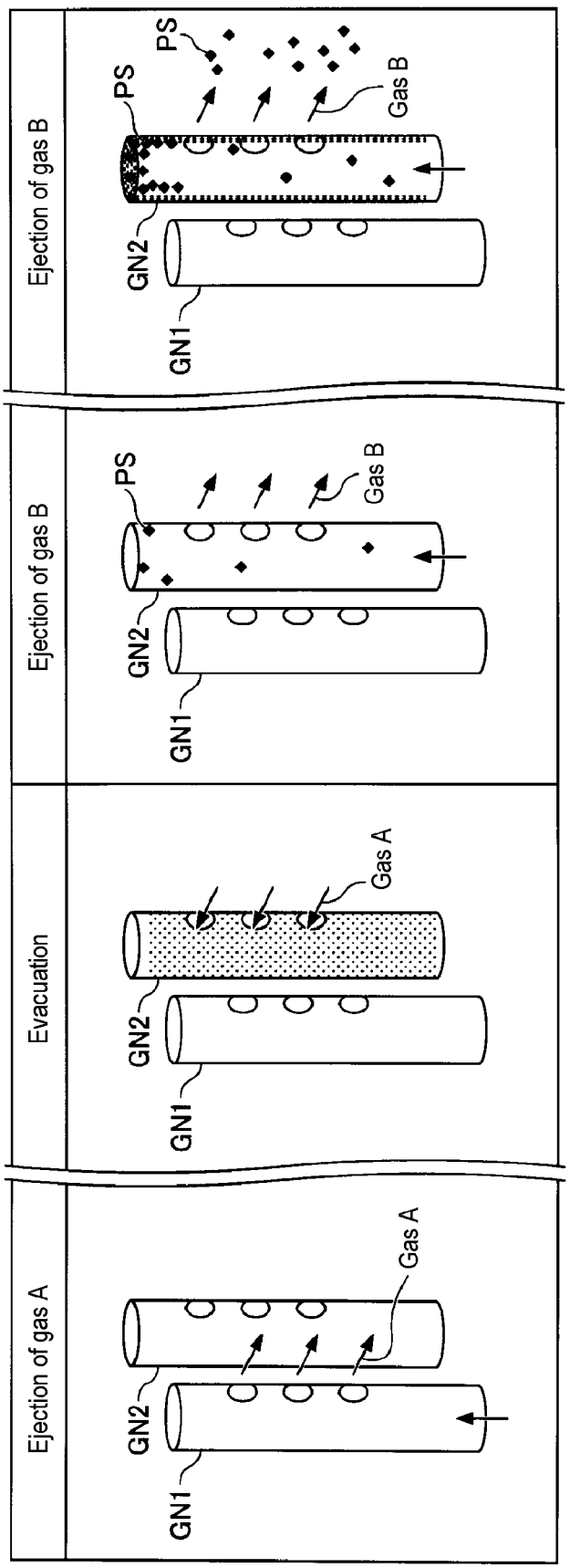
FIGS. 6A to 6D are views illustrating a particle generation mechanism.

First, as illustrated in FIG. 6A, the gas A is ejected into the processing container from a gas nozzle GN1. As a result, the interior of the processing container becomes an atmosphere of the gas A.

Subsequently, the gas A remaining in the processing container is discharged through cycle purging in which gas replacement and evacuation are repeatedly performed. The gas replacement is an operation of supplying a purge gas into the processing container. The evacuation is an operation of evacuating the interior of the processing container using a vacuum pump. As illustrated in FIG. 6B, when the evacuation is performed, the gas A may reversely diffuse into a gas nozzle GN2, and may stay in the gas nozzle GN2.

Subsequently, as illustrated in FIG. 6C, the gas B is ejected into the processing container from the gas nozzle GN2. At this time, the gas B reacts with the gas A reversely diffused inside the gas nozzle GN2, which may result in the generation of particle sources PS.

Subsequently, the gas B remaining in the processing container is discharged through the cycle purging in which the gas replacement and the evacuation are repeatedly performed.

Then, by repeating an ALD cycle including the ejection of the gas A, the cycle purging, the ejection of the gas B, and the cycle purging, the particle sources PS are accumulated in the gas nozzle GN2, as illustrated in FIG. 6D. In particular, since the tip of the gas nozzle GN2 does not allow gas to escape easily, the particle sources PS tend to accumulate. In this state, as illustrated FIG. 6D, when the gas B is ejected from the gas nozzle GN2, the particle sources PS accumulated in the gas nozzle GN2 are ejected into the processing container together with the gas B. As a result, for example, particles adhere to the wafers W inside the processing container.

[Substrate Processing Method]

A substrate processing method of an embodiment will be described by taking as an example a method of forming a silicon oxide film on the wafer W through the ALD method using the substrate processing apparatus 1 described above.

First, the controller 90 controls the lift mechanism 25 to load the boat 16 holding the plurality of wafers W into the processing container 10, and hermetically seals the lower end opening of the processing container 10 using the lid 21.

Subsequently, the controller 90 repeats a cycle including step S1 of supplying the raw material gas, step S2 of performing purging, step S3 of supplying the reaction gas, and step S4 of performing the purging a predetermined number of times, thereby forming the silicon oxide film having a desired thickness on each of the plurality of wafers W.

In step S1, a silicon-containing gas as the raw material gas is ejected from the gas nozzle 31 into the processing container 10 so that the silicon-containing gas is adsorbed onto each of the plurality of wafers W.

In step S2, the silicon-containing gas and the like remaining in the processing container 10 are discharged through the cycle purging in which gas replacement and evacuation are repeated. The gas replacement is an operation of supplying the purge gas from the gas nozzle 33 into the processing container 10. The evacuation is an operation of evacuating the interior of the processing container 10 using a vacuum pump 53. In step S2, during the evacuation, the silicon-containing gas may reversely diffuse into the gas nozzle 32 through the plurality of gas holes 32a, and may remain at the tip of the gas nozzle 32. However, in the substrate processing apparatus 1 of the embodiment, the reversely-diffused silicon-containing gas easily escapes from the interior of the gas nozzle 32 through the tip hole 32b, which makes it difficult for the silicon-containing gas to stay at the tip of the gas nozzle 32.

In step S3, an oxidation gas as a reaction gas is ejected from the gas nozzle 32 into the processing container 10, and the silicon raw material gas adsorbed onto the plurality of wafers W is oxidized by the oxidation gas. At this time, since almost no silicon-containing gas remains at the tip of the gas nozzle 32, it is possible to suppress the generation of particles by the reaction of the oxidation gas with the silicon-containing gas inside the gas nozzle 32.

In step S4, the oxidation gas and the like remaining in the processing container 10 are discharged through the cycle purging in which the gas replacement and the evacuation are repeated.

After the ALD cycle including steps S1 to S4 is repeated a predetermined number of times, the controller 90 controls the lift mechanism 25 to unload the boat 16 from the interior of the processing container 10.

As described above, according to the substrate processing method of the embodiment, since the tip hole 32b is provided at the tip of the gas nozzle 32, the silicon-containing gas, which may reversely diffuse into the gas nozzle 32 during the evacuation, easily escapes from the interior of the gas nozzle 32 through the tip hole 32b. This makes it possible to suppress the retention of the silicon-containing gas at the tip of the gas nozzle 32, and thus to suppress the generation of particles due to the reaction of the oxidation gas with the silicon-containing gas inside the gas nozzle 32. As a result, it is possible to suppress the emission of particles from the interior of the gas nozzle 32 toward the plurality of wafers W.

EXAMPLES

In examples, in order to confirm the effects of the substrate processing apparatus 1 according to the embodiment, numerical analysis was performed on a flow velocity distribution and a concentration distribution of an ozone gas when the ozone gas was ejected from gas nozzles having tip holes of different diameters, different numbers, and different orientation angles with respect to the tube axis (hereinafter, referred to as "orientation angles"). In the numerical analysis, a fluid analysis software (Fluent) produced by Ansys Corporation was used.

Figure 7:
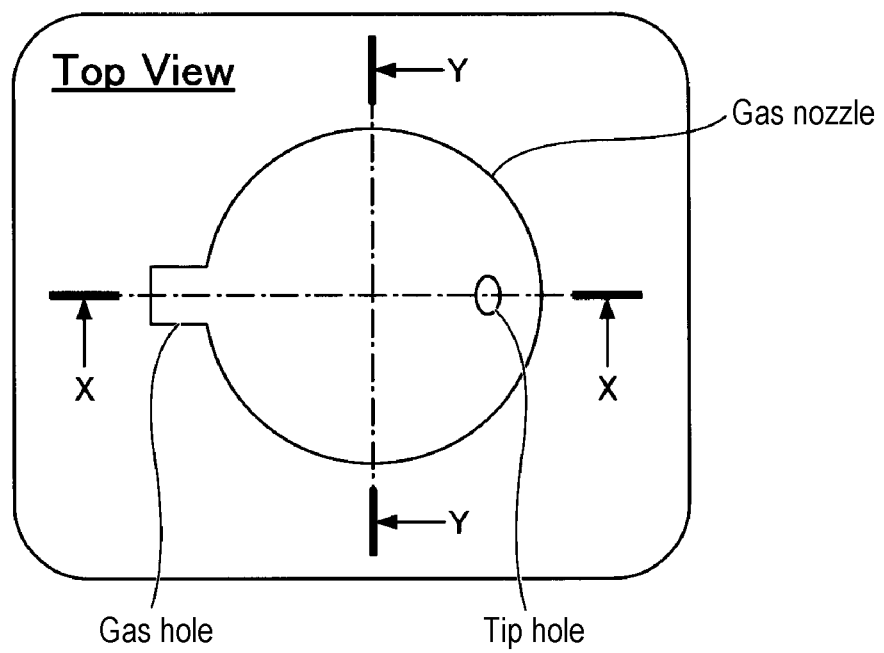
FIG. 7 is a view illustrating a gas nozzle when viewed from above.

In the following examples, as illustrated in FIG. 7, a cross section including a gas hole and a tip hole will be referred to as an X-X cross section, and a cross section perpendicular to the X-X cross section will be referred to as a Y-Y cross section. FIG. 7 is a view illustrating a gas nozzle when viewed from above.

Example 1

In Example 1, the flow velocity distributions of the ozone gas when the ozone gas was ejected from three types of gas nozzles A1 to A3 were analyzed.

Each of the gas nozzles A1 to A3 is provided with a plurality of gas holes each having a hole diameter Φ of 1.0 mm at intervals along the longitudinal direction of the respective nozzle. In addition, the gas nozzles A1, A2, and A3 are provided with tip holes having hole diameters Φ of 1.0 mm, 1.5 mm, and 2.0 mm, respectively, at positions where the orientation angle is 0 degrees.

Figure 8:
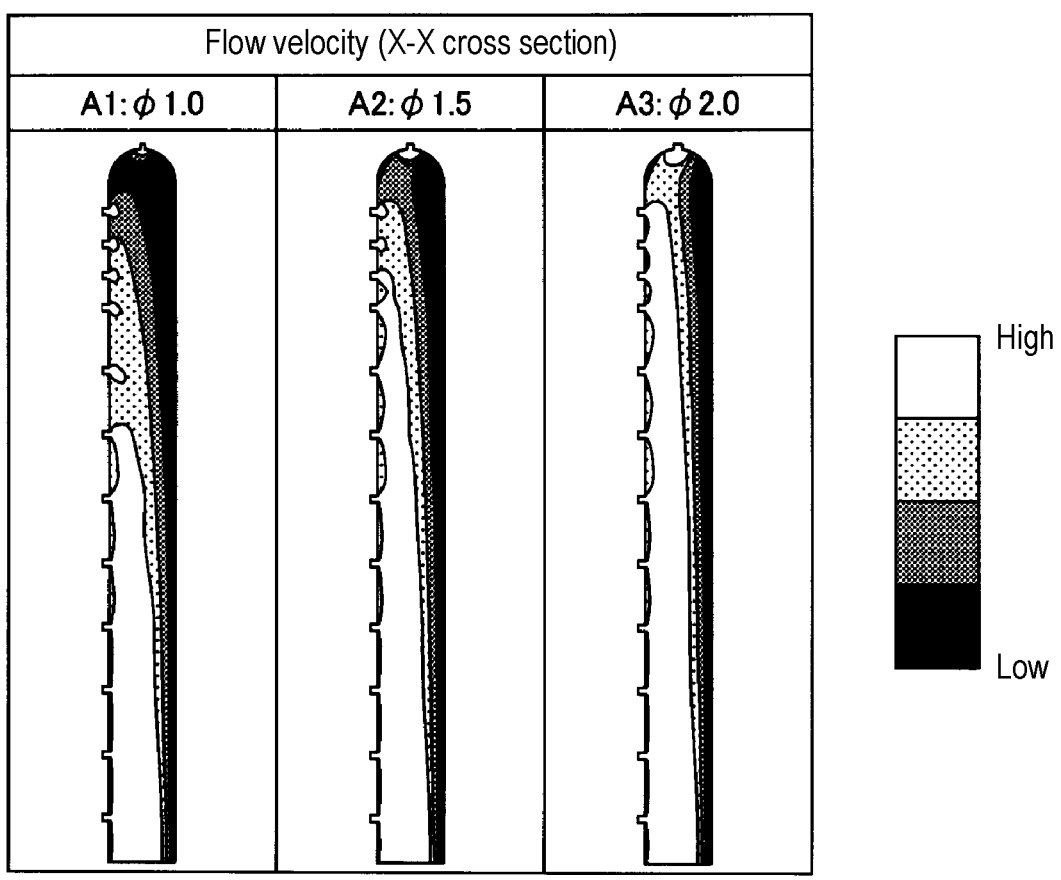
FIG. 8 is a view showing the results of numerical analysis of Example 1.

FIG. 8 is a view showing the results of the numerical analysis in Example 1, and shows the flow velocity distributions of the ozone gas in the gas nozzles in the X-X cross sections.

As shown in FIG. 8, it can be seen that the flow velocity at the tip of the gas nozzle is increased by increasing the hole diameter Φ of the tip hole from 1.0 mm to 1.5 mm. That is, it can be said that it is possible to increase the flow velocity at the tip of the gas nozzle by setting the hole diameter Φ of the tip hole to be 1.5 times the hole diameter Φ of the gas hole.

In addition, it can be seen that by increasing the hole diameter Φ of the tip hole to 2.0 mm, the flow velocity at the tip of the gas nozzle is higher than that in the case in which the hole diameter Φ of the tip hole is 1.5 mm. That is, it can be said that it is possible to further increase the flow velocity at the tip of the gas nozzle by setting the hole diameter Φ of the tip hole to be 2.0 times the hole diameter Φ of the gas holes.

Example 2

In Example 2, the flow velocity distributions of the ozone gas when the ozone gas was ejected from three types of gas nozzles A1, A4, and A5 were analyzed.

Each of the gas nozzles A1, A4, and A5 is provided with a plurality of gas holes each having a hole diameter Φ of 1.0 mm at intervals along the longitudinal direction of the respective nozzle. In addition, the gas nozzle A1 is provided with a tip hole having a hole diameter Φ of 1.0 mm at a position where the orientation angle is 0 degrees. The gas nozzle A4 is provided with tip holes each having a hole diameter Φ of 1.0 mm at positions where the orientation angles are 0 degrees and 45 degrees, respectively. The gas nozzle A5 is provided with a tip hole having a hole diameter Φ of 2.0 mm at a position where the orientation angle is 45 degrees.

Figure 9:
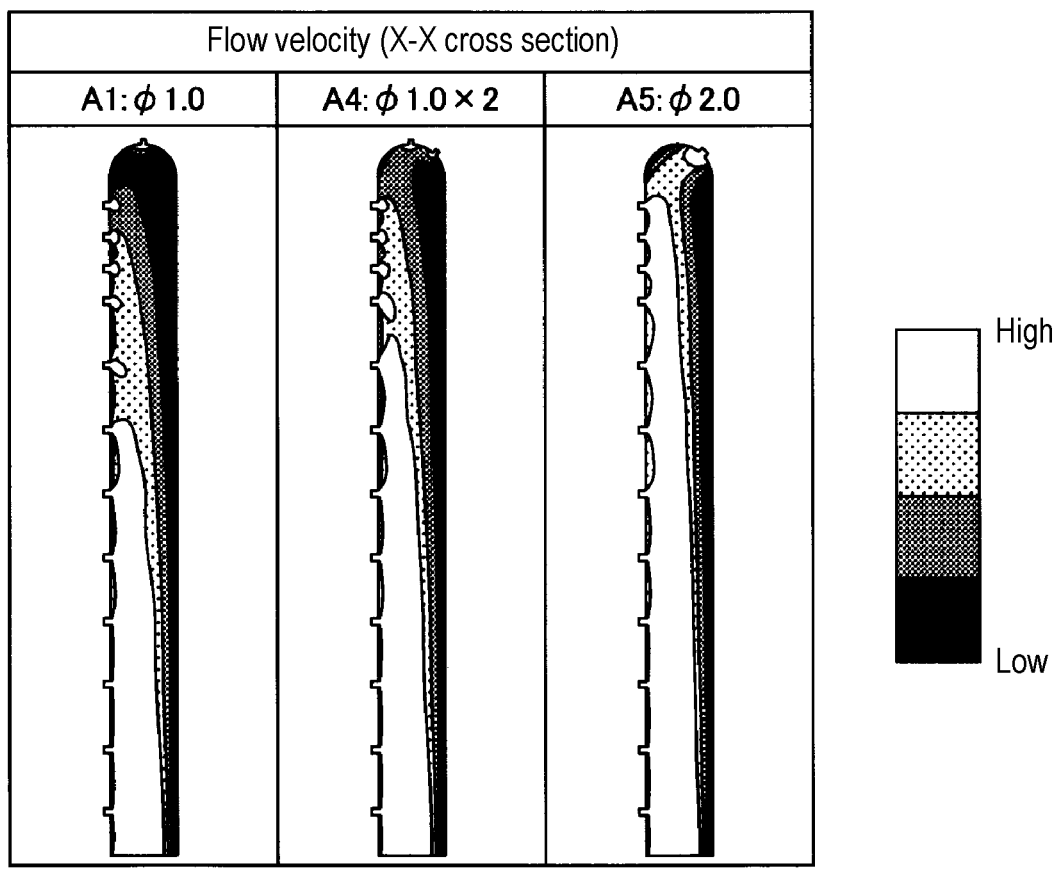
FIG. 9 is a view showing the results of numerical analysis of Example 2.

FIG. 9 is a view showing the results of the numerical analysis in Example 2, and shows the flow velocity distributions of the ozone gas in the gas nozzles in the X-X cross sections.

As shown in FIG. 9, it can be seen that the flow velocity at the tip of a gas nozzle is increased by providing two tip holes (having the orientation angles of 0 degrees and 45 degrees). That is, it can be said that it is possible to increase the flow velocity at the tip of the gas nozzle by increasing the number of tip holes.

In addition, it can be seen that the flow velocity at the tip of the gas nozzle is particularly increased by changing the orientation angle of the tip hole from 0 degrees to 45 degrees and increasing the hole diameter Φ from 1.0 mm to 2.0 mm. That is, it can be said that it is possible to particularly increase the flow velocity at the tip of the gas nozzle by changing the orientation angle from 0 degrees to 45 degrees and setting the hole diameter Φ of the tip hole to be 2.0 times the hole diameter Φ of the gas holes.

Example 3

In Example 3, the numerical analysis was performed on the flow velocity distributions of the ozone gas when the ozone gas was ejected from four types of gas nozzles A6 to A9.

Each of the gas nozzles A6 to A9 is provided with a plurality of gas holes each having a hole diameter Φ of 1.0 mm at intervals along the longitudinal direction of the respective nozzle. In addition, the gas nozzles A6 to A9 are provided with tip holes each having a hole diameter Φ of 2.0 mm at positions where the orientation angles are 0 degrees, 30 degrees, 60 degrees, and 90 degrees, respectively.

Figure 10A:
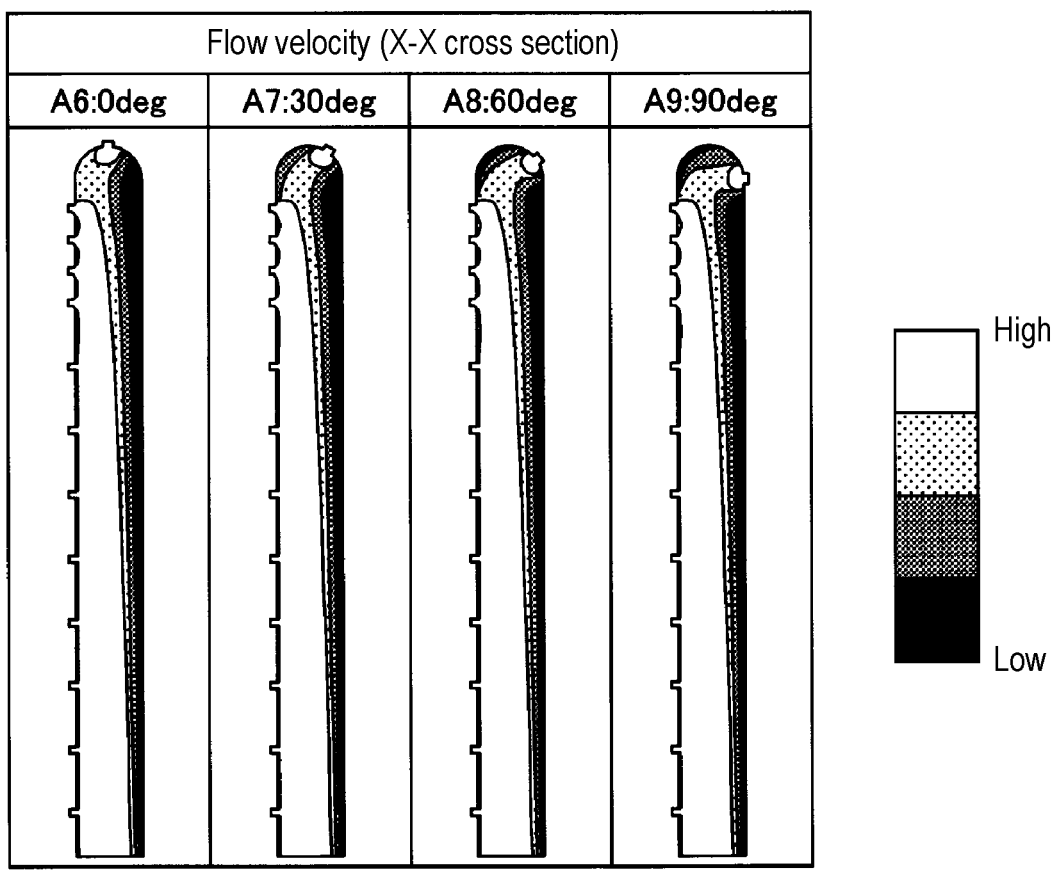
FIGS. 10A and 10B are views showing the results of numerical analysis of Example 3.
Figure 10B:
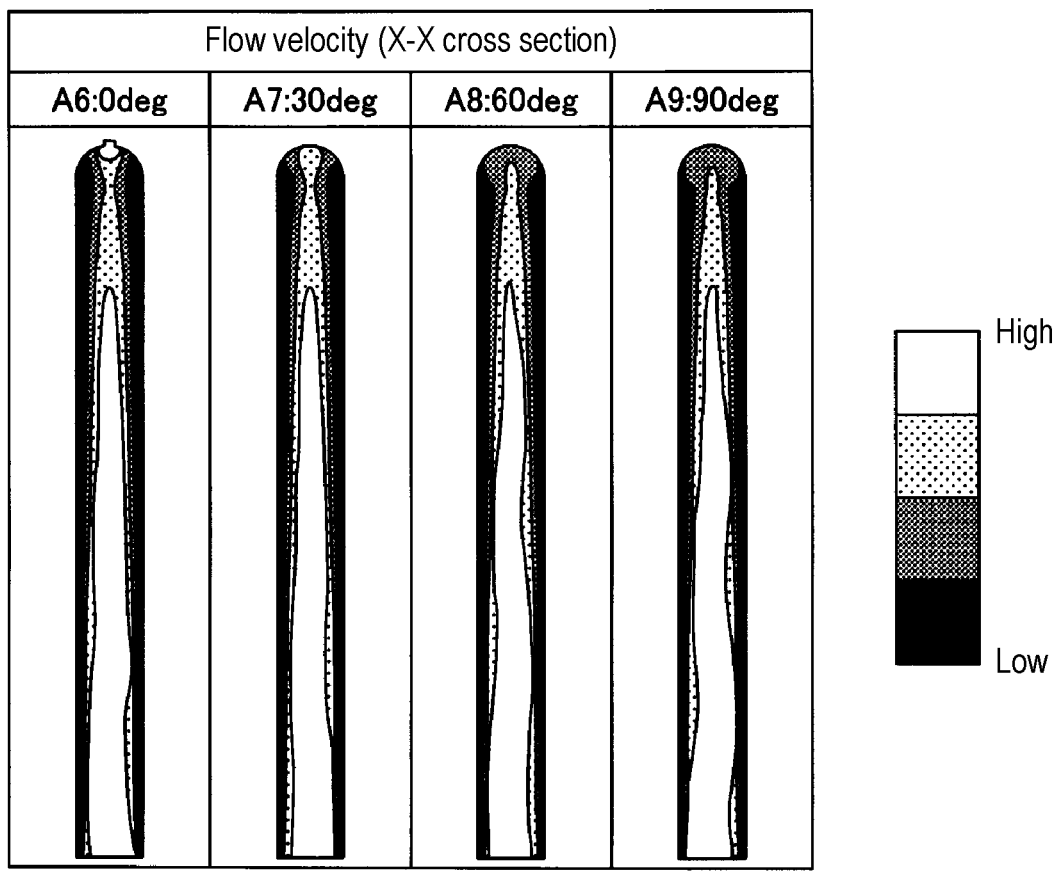

FIGS. 10A and 10B are views showing the results of the numerical analysis in Example 3. FIG. 10A shows the flow velocity distributions of the ozone gas inside the gas nozzles in the X-X cross-sections, and FIG. 10B shows the flow velocity distributions of the ozone gas inside the gas nozzles in the Y-Y cross sections.

As illustrated in FIG. 10A, it can be seen that by increasing the orientation angle of the tip hole from 0 degrees to 30 degrees, 60 degrees, and 90 degrees, it is possible to increase the flow velocity at the tip of the gas nozzle at the side opposite to the side at which the gas holes are provided. That is, it can be said that it is possible to increase the flow velocity at the side opposite to the side at which the gas holes are provided at the tip of the gas nozzle by increasing the orientation angle of the tip hole. However, as shown in FIG. 10B, it can be seen that the flow velocity distributions are distorted in the longitudinal direction of the gas nozzles in the Y-Y cross sections.

Example 4

In Example 4, the numerical analysis was performed on the flow velocity distributions of the ozone gas when the ozone gas was ejected from the gas nozzle A1.

The gas nozzle A10 is provided with a plurality of gas holes each having a hole diameter Φ of 1.0 mm at intervals along the longitudinal direction of the gas nozzle A10. In addition, the gas nozzle A10 is provided with tip holes each having a hole diameter Φ of 2.0 mm at positions where the orientation angles are 45 degrees and 90 degrees, respectively.

Figure 11:
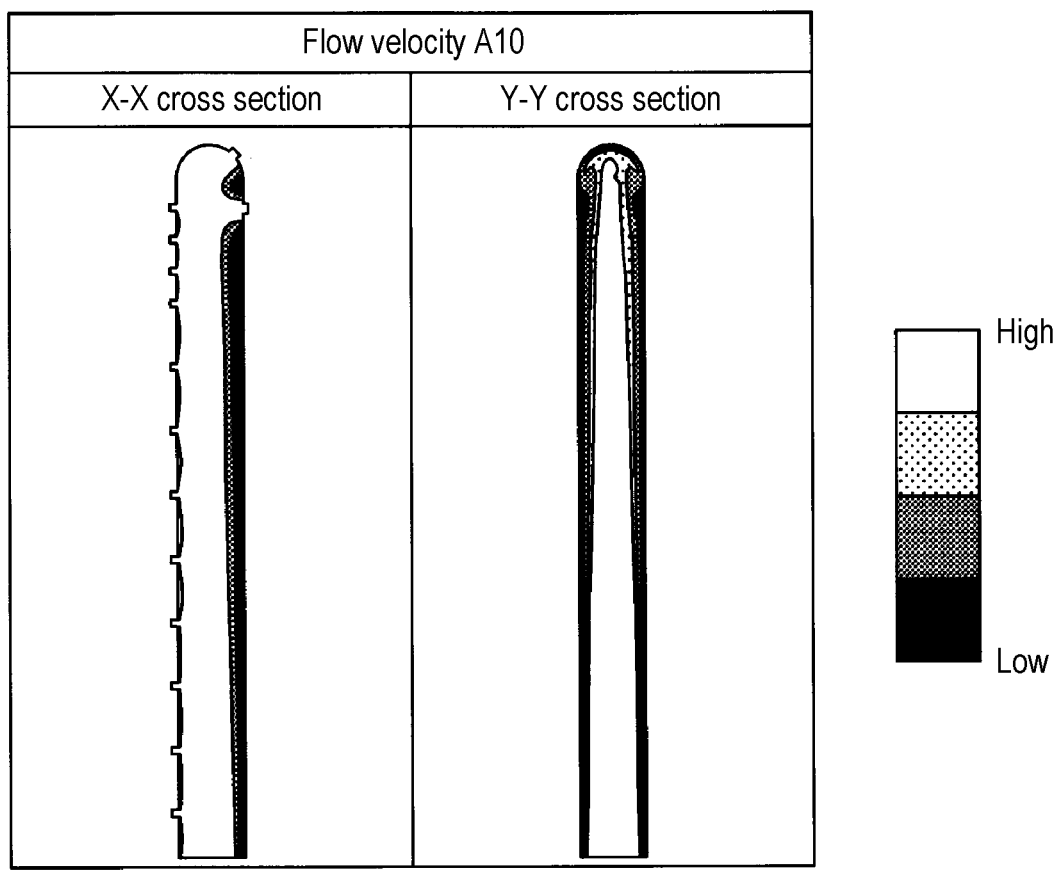
FIG. 11 is a view showing the results of numerical analysis of Example 4.

FIG. 11 is a view showing the results of the numerical analysis in Example 4. The left side in FIG. 11 shows the flow velocity distribution of the ozone gas in the gas nozzle in the X-X cross section, and the right side in FIG. 11 shows the flow velocity distribution of the ozone gas in the gas nozzle in the a Y-Y cross section.

As shown at the left side in FIG. 11, it can be seen that, by providing tip holes each having a hole diameter of 2.0 mm at positions where the orientation angles are 45 degrees and 90 degrees, respectively, the flow velocity at the tip of the gas nozzle is particularly high at the side opposite to the side at which the gas holes are provided. That is, by providing a plurality of tip holes at the side opposite to the side at which the gas holes are provided and setting the hole diameter Φ of each tip hole to be larger than that of each gas hole, it is possible to particularly increase the flow velocity at the tip of the gas nozzle at the side opposite to the side at which the gas holes are provided. In addition, as shown at the right side in FIG. 11, it can be seen that almost no distortion occurred in the flow velocity distribution in the longitudinal direction of the gas nozzle in the Y-Y cross section.

Example 5

In Example 5, the numerical analysis was performed on the concentration distributions of the ozone gas when the ozone gas was ejected from four types of gas nozzles A6 to A9, which are the same as those in Example 3.

Figure 12A:
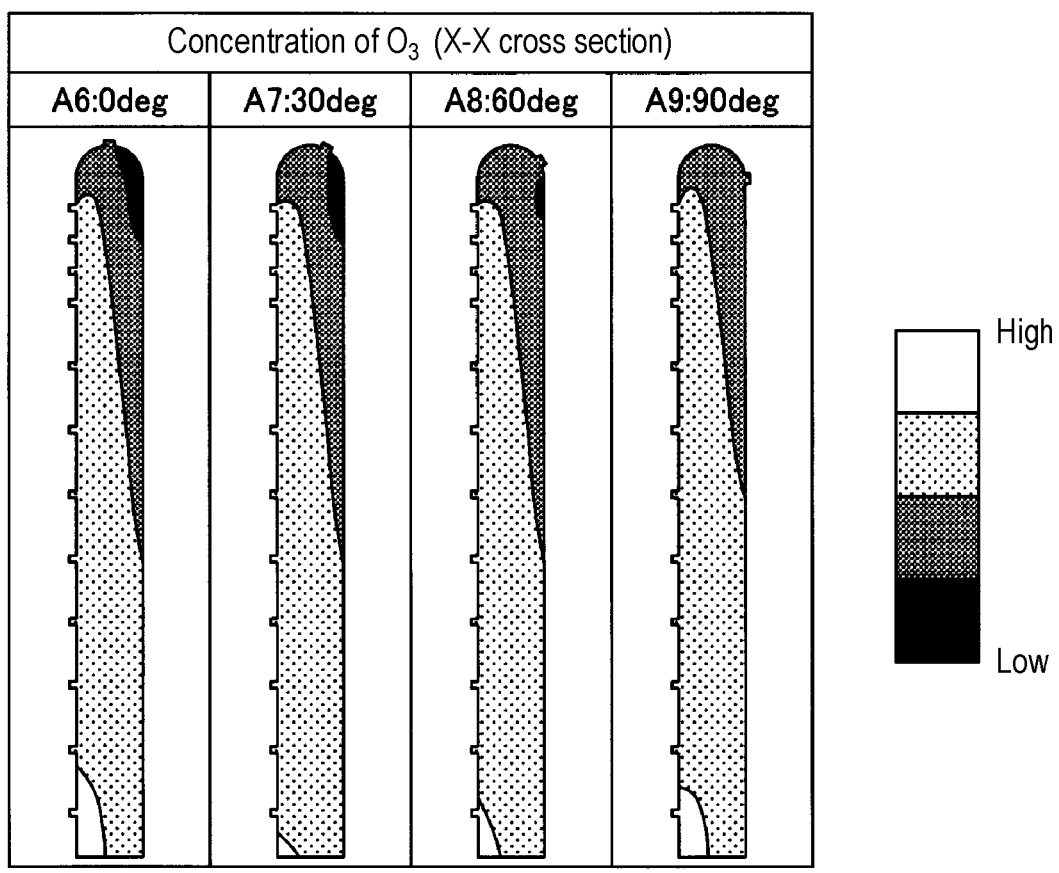
FIGS. 12A and 12B are views showing the results of numerical analysis of Example 5.
Figure 12B:
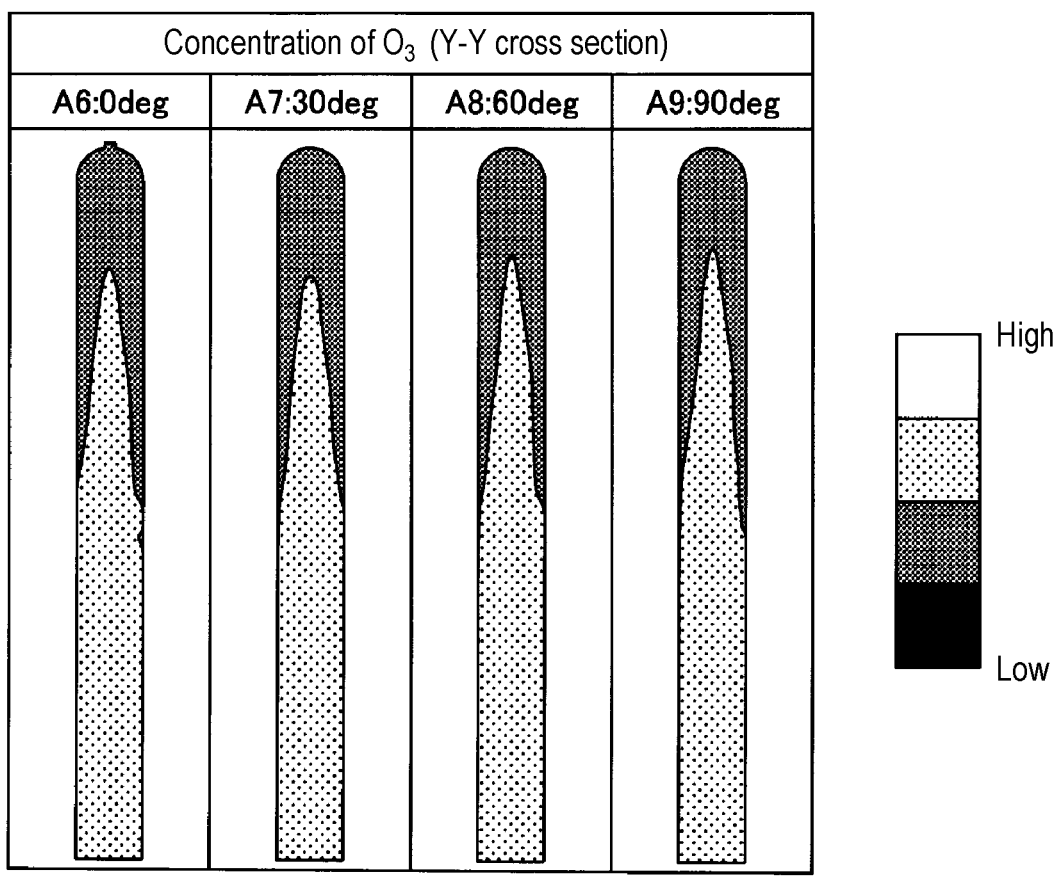

FIGS. 12A and 12B are views showing the results of the numerical analysis in Example 5. FIG. 12A shows the concentration distributions of the ozone gas inside the gas nozzles in the X-X cross sections, and FIG. 12B shows the concentration distributions of the ozone gas inside the gas nozzles in the Y-Y cross sections.

As illustrated in FIGS. 12A and 12B, it can be seen that, by increasing the orientation angle of the tip hole from 0 degrees to 30 degrees, 60 degrees, and 90 degrees, the region where the concentration of the ozone gas at the tip of the gas nozzle is low is reduced and the uniformity of the concentration of the ozone gas in the gas nozzle is improved. That is, it can be said that by increasing the orientation angles of the tip hole, it is possible to increase the uniformity of the concentration of the ozone gas inside the gas nozzle.

Example 6

In Example 6, the numerical analysis was performed on the concentration distribution of the ozone gas when the ozone gas was ejected from the gas nozzle A10, which is the same as that in Example 4.

Figure 13:
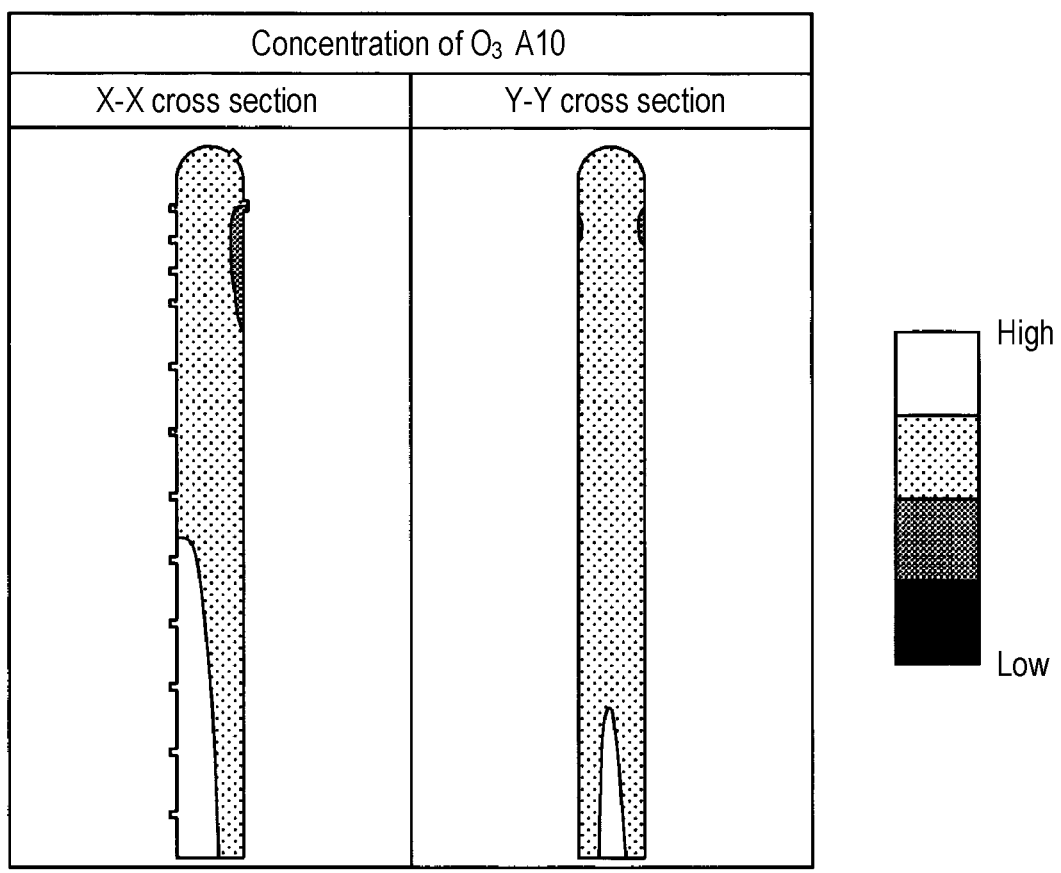
FIG. 13 is a view showing the results of numerical analysis of Example 6.

FIG. 13 is a view showing the results of the numerical analysis in Example 6. The left side in FIG. 13 shows the concentration distribution of the ozone gas inside the gas nozzle in the X-X cross section, and the right side in FIG. 13 shows the concentration distribution of the ozone gas inside the gas nozzle in the Y-Y cross section.

As shown in FIG. 13, it can be seen that, by providing tip holes each having a hole diameter Φ of 2.0 mm at positions where the orientation angles are 45 degrees and 90 degrees, respectively, the region where the concentration of the ozone gas at the tip of the gas nozzle is low is reduced and the uniformity of the concentration of the ozone gas inside the gas nozzle is improved. That is, by providing the plurality of tip holes at the side opposite to the side in which the gas holes are provided and setting the hole diameter Φ of each tip hole to be larger than that of the gas holes, it is possible to particularly improve the uniformity of the concentration of the ozone gas inside the gas nozzle.

In addition, in the embodiments described above, the gas nozzle 31 is an example of a first gas nozzle, and the gas nozzle 32 is an example of a second gas nozzle. In addition, the gas holes 32a are examples of first gas holes, the tip hole 32b is an example of a second gas hole, and the second tip hole 32c is an example of a third gas hole. The raw material gas is an example of a first processing gas, and the reaction gas is an example of a second processing gas.

It should be understood that the embodiments disclosed herein are illustrative and are not limiting in all aspects. The above-described embodiments may be omitted, replaced, or modified in various forms without departing from the scope and spirit of the appended claims.

In the embodiments described above, the case in which the gas holes 32a are oriented toward the center side (the side of the wafer W) of the internal tube 11, and the tip hole 32b and/or the second tip hole 32c are oriented toward the inner wall side near the internal tube 11 has been described as an example, but the present disclosure is not limited thereto. For example, the gas holes 32a may be oriented toward the inner wall side near the internal tube 11, and the tip hole 32b and/or the second tip hole 32c may be oriented toward the center side (the side of the wafer W) of the internal tube 11.

In the embodiments described above, the case in which the gas nozzles 31 to 33 are L-shaped pipes has been described as an example, but the present disclosure is not limited thereto. For example, the gas nozzles 31 to 33 may be straight pipes that extend inside the inner wall of the internal tube 11 along the longitudinal direction of the internal tube 11 and each have a lower end inserted into and supported by a nozzle support (not illustrated).

In the embodiments described above, the case in which the gas nozzle 32 is provided with the tip hole 32b and/or the second tip hole 32c has been described as an example, but the present disclosure is not limited thereto. For example, the gas nozzle 31 may be provided with a tip hole 31b and/or a second tip hole 31c. In this case, the retention of raw material gas at the tip of the gas nozzle 31 is suppressed. In addition, since it is possible to reduce the size of the gas retention region at the tip of the gas nozzle 31, it is possible to suppress over-decomposition of the raw material gas.

In the embodiments described above, the case in which three gas nozzles 31 to 33 are provided has been described as an example, but the present disclosure is not limited thereto. For example, the number of gas nozzles may be one, two, or four or more.

In the embodiments described above, the case in which the processing container 10 is a container of a double-tube structure having the internal tube 11 and the external tube 12 has been described, but the present disclosure is not limited thereto. For example, the processing container 10 may be a container of a single tube structure.

In the embodiments described above, the case in which the gas nozzles of the embodiments are applied to form a film through the ALD method has been described as an example, but the present disclosure is not limited thereto. For example, the gas nozzles of the embodiments also are also applicable to form a film through a chemical vapor deposition (CVD) method.

According to the present disclosure, it is possible to suppress retention of a gas at a tip of a gas nozzle.

What is claimed is:

1. A gas nozzle extending vertically inward of an inner wall of a processing container having a substantially cylindrical shape, comprising:
　a cylindrical portion having a cylindrical shape in the inner wall;
　a closing portion located at a tip of the cylindrical portion to close the tip and having a rounded curved surface shape;

a plurality of first gas holes provided at the cylindrical portion at intervals in a longitudinal direction; and a second gas hole provided at the closing portion and oriented diagonally upward with respect to the inner wall on a side opposite to a side in which the plurality of first gas holes are provided in a plan view from the longitudinal direction, wherein the second gas hole has an opening area larger than an opening area of each of the first gas holes.

2. The gas nozzle of claim 1, wherein the second gas hole has an orientation angle of 30 to 90 degrees with respect to the longitudinal direction.

3. The gas nozzle of claim 2, wherein the second gas hole is an opening that is circular, elliptical, rectangular, or rounded-corner rectangular in shape.

4. The gas nozzle of claim 3, further comprising:

a third gas hole provided at the cylindrical portion on the side opposite to the side in which the plurality of first gas holes are provided in the plan view from the longitudinal direction, wherein the third gas hole is oriented in a direction different from a direction of the second gas hole.

5. The gas nozzle of claim 4, wherein the plurality of first gas holes are oriented toward a center side of the processing container.

6. The gas nozzle of claim 1, wherein the second gas hole is an opening that is circular, elliptical, rectangular, or rounded-corner rectangular in shape.

7. The gas nozzle of claim 1, further comprising:

a third gas hole provided at the cylindrical portion on the side opposite to the side in which the plurality of first gas holes are provided in the plan view from the longitudinal direction, wherein the third gas hole is oriented in a direction different from a direction of the second gas hole.

8. The gas nozzle of claim 1, wherein the plurality of first gas holes are oriented toward a center side of the processing container.

9. A substrate processing apparatus comprising:

a processing container having a substantially cylindrical shape; and a gas nozzle extending vertically inward of an inner wall of the processing container, wherein the gas nozzle includes:

a cylindrical portion having a cylindrical shape in the inner wall;

a closing portion located at a tip of the cylindrical portion to close the tip and having a rounded curved surface shape;

a plurality of first gas holes provided at the cylindrical portion at intervals in a longitudinal direction; and a second gas hole provided at the closing portion and oriented diagonally upward with respect to the inner wall on a side opposite to a side at which the plurality of first gas holes are provided in a plan view from the longitudinal direction, wherein the second gas hole has an opening area larger than that of each of the first gas holes.

* * * * *